(12) United States Patent
Richter et al.

(10) Patent No.: US 8,034,726 B2
(45) Date of Patent: Oct. 11, 2011

(54) INTERLAYER DIELECTRIC MATERIAL IN A SEMICONDUCTOR DEVICE COMPRISING A DOUBLET STRUCTURE OF STRESSED MATERIALS

(75) Inventors: Ralf Richter, Dresden (DE); Michael Finken, Dresden (DE); Joerg Hohage, Dresden (DE); Heike Salz, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 225 days.

(21) Appl. No.: 12/165,756

(22) Filed: Jul. 1, 2008

(65) Prior Publication Data
US 2009/0166800 A1     Jul. 2, 2009

(30) Foreign Application Priority Data
Dec. 31, 2007   (DE) .......................... 10 2007 063 230

(51) Int. Cl.
H01L 21/31   (2006.01)
(52) U.S. Cl. ........................................ 438/783; 257/369
(58) Field of Classification Search ................. 438/783; 257/369
See application file for complete search history.

(56) References Cited

U.S. PATENT DOCUMENTS

| | | | |
|---|---|---|---|
| 6,436,747 B1 | 8/2002 | Segawa et al. ................. | 438/197 |
| 6,953,728 B2 | 10/2005 | Murakami et al. ............. | 438/275 |
| 7,060,549 B1 | 6/2006 | Craig et al. .................... | 438/199 |
| 7,190,033 B2 * | 3/2007 | Chang et al. ................... | 257/371 |
| 7,470,618 B2 | 12/2008 | Sayama et al. ................. | 438/663 |
| 2004/0198002 A1 | 10/2004 | Murakami et al. ............. | 438/279 |
| 2005/0118765 A1 | 6/2005 | Taniguchi et al. ............. | 438/275 |
| 2005/0214998 A1 * | 9/2005 | Chen et al. ..................... | 438/199 |
| 2005/0218455 A1 | 10/2005 | Maeda et al. .................. | 257/368 |
| 2005/0260806 A1 * | 11/2005 | Chang et al. ................... | 438/197 |
| 2006/0223290 A1 | 10/2006 | Belyansky et al. ............ | 438/520 |
| 2007/0010073 A1 | 1/2007 | Chen et al. ..................... | 438/486 |
| 2007/0122966 A1 * | 5/2007 | Hoentschel et al. ........... | 438/231 |
| 2008/0124858 A1 | 5/2008 | Nguyen et al. ................. | 438/217 |
| 2008/0303090 A1 | 12/2008 | Ieong et al. .................... | 257/351 |

FOREIGN PATENT DOCUMENTS

| | | |
|---|---|---|
| DE | 102005057074 A1 | 5/2007 |
| DE | 102007052051 A1 | 5/2009 |
| JP | 02201922 A1 | 8/1990 |
| WO | WO 2007/126807 A1 | 11/2007 |
| WO | WO 2008/016505 A1 | 2/2008 |

OTHER PUBLICATIONS

Translation of Official Communication from German Patent Office for German Patent Application No. 10 2007 063 230.6-33 dated Sep. 21, 2009.

* cited by examiner

*Primary Examiner* — N Drew Richards
*Assistant Examiner* — Yu-Hsi Sun
(74) *Attorney, Agent, or Firm* — Williams, Morgan & Amerson, P.C.

(57) ABSTRACT

By forming a buffer material above differently stressed contact etch stop layers followed by the deposition of a further stress-inducing material, enhanced overall device performance may be accomplished, wherein an undesired influence of the additional stress-inducing layer may be reduced in device regions, for instance, by removing the additional material or by performing a relaxation implantation process. Furthermore, process uniformity during a patterning sequence for forming contact openings may be enhanced by partially removing the additional stress-inducing layer at an area at which a contact opening is to be formed.

16 Claims, 7 Drawing Sheets

INTERLAYER DIELECTRIC MATERIAL IN A SEMICONDUCTOR DEVICE COMPRISING A DOUBLET STRUCTURE OF STRESSED MATERIALS

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors used for generating strain in channel regions of the transistors.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

During the formation of the two types of stressed layers, conventional techniques may suffer from reduced efficiency and increased yield loss when device dimensions are increasingly scaled by using the 90 nm technology and even further advanced approaches, due to the limited conformal deposition capabilities of the deposition process involved, which may result in respective process non-uniformities during subsequent process steps for patterning the stressed layer and forming contact openings, as will be explained in more detail with reference to FIGS. 1a-1b.

FIG. 1a schematically illustrates a cross-sectional view of a semiconductor device 100 in a certain manufacturing stage for forming stress-inducing layers above a first device area 120A and a second device area 120B. The first and second device areas 120A, 120B, which typically represent respective transistor elements, may be formed above a substrate 101 comprising a semiconductor layer 102, such as a silicon-based layer, which may be separated from the substrate 101 by an appropriate buried insulating layer if a silicon-on-insulator (SOI) configuration is considered. In the example shown, the first and second device areas 120A, 120B may comprise a plurality of transistor elements with a lateral distance according to the design rules of the technology under consideration. The transistors in the first and second device areas 120A, 120B may comprise a gate electrode 121 formed on a respective gate insulation layer, which separates the gate electrode 121 from a corresponding channel region 124, which is laterally located between respective drain/source regions 125. Furthermore, a sidewall spacer structure 122 may be formed on sidewalls of the gate electrode 121. Typically, metal silicide regions (not shown) may be provided in the drain and source regions 125 and the gate electrodes 121 in order to enhance the conductivity of these areas. The semiconductor device 100 may represent an advanced device in which critical dimensions, such as the gate length, i.e., in FIG. 1a, the horizontal extension of the gate electrodes 121, may be approximately 50 nm or significantly less. Consequently, a distance between respective transistor elements, i.e., the lateral distance between neighboring sidewall spacer structures 122 of closely spaced transistor elements, may be approximately 100 nm or even less, wherein, depending on the device configuration, in dense device areas, a plurality of closely spaced circuit elements may be provided.

It should be appreciated that the first and second device regions 120A, 120B may be separated by an appropriate isolation structure (not shown) if required. Furthermore, in the manufacturing stage shown in FIG. 1a, a silicon nitride layer 130 comprising a high intrinsic stress may be formed above the first and second device areas 120A, 120B followed by an etch indicator layer 131 comprised of silicon dioxide. It should be appreciated that, if required, an etch stop layer, such as a silicon dioxide layer of appropriate thickness and density, may be provided between the silicon nitride layer 130 and the respective transistor elements in the first and second device areas 120A, 120B.

As is evident from FIG. 1a, due to the reduced spacing between neighboring transistor elements, the silicon nitride layer 130 may define a respective surface topography in which tapered recesses, also referred to as seams 132, may be formed between the closely spaced transistor elements, since the spacing between the transistor elements may be in the order of two times a layer thickness of the silicon nitride layer 130, which, in combination with the limited conformal fill behavior, may even result in corresponding defects, such as voids 132A and the like.

Furthermore, in this manufacturing stage, the semiconductor device 100 may comprise a resist mask 103 exposing the first device area 120A, while covering the second device area 120B. In this case, it may be assumed that the intrinsic stress of the silicon nitride layer 130 may be appropriately selected so as to enhance the transistor performance in the second device area 120B, which may, for instance, include N-channel transistors requiring a high tensile stress in the layer 130.

A typical process flow for forming the semiconductor device 100 as shown in FIG. 1a may comprise the following processes. The gate electrodes 121 and the gate insulation layers may be formed and patterned on the basis of well-established process techniques, including advanced photolithography, deposition, oxidation and etch techniques. Thereafter, the drain and source regions 125 may be formed in combination with the sidewall spacer structures 122 on the basis of well-established deposition processes, anisotropic etch processes and implantation sequences in order to establish the desired vertical and lateral dopant profile. Thereafter, respective silicide regions may be formed, if required, on the basis of well-established techniques. Next, if required, a corresponding silicon dioxide etch stop layer may be formed, followed by the deposition of the silicon nitride layer 130. During the deposition of the silicon nitride material, respective process parameters, such as composition of carrier gases and reactive gases, substrate temperature, deposition pressure and, in particular, ion bombardment during the deposition, may significantly influence the finally obtained intrinsic stress of the material as deposited with respect to the underlying materials. For example, when the layer 130 is deposited with high tensile stress of up to 1 GPa or even significantly higher, the ion bombardment is reduced, for instance, by establishing the deposition atmosphere with a low level of radio frequency (RF) power to obtain the desired tensile property of the material as deposited. However, the moderately low RF power may result in reduced surface diffusion of the reactive species in the deposition ambient, thereby compromising conformality. Due to the less pronounced conformality of the silicon nitride deposition process above a certain layer thickness and for increased aspect ratios, as may occur in highly scaled devices, caused by the reduced distance between the neighboring transistor elements at moderately dimensioned gate heights in densely packed device areas, as shown, the silicon nitride material may merge in the lateral growth direction between closely spaced transistor elements, thereby forming the respective seam 132, or respective overhangs may form, thereby resulting in the void 132A. Thus, in the subsequent deposition of the silicon dioxide layer 131, the local deposition conditions at the seam 132 may result in a non-uniformity of the layer thickness, thereby giving rise to respective etch non-uniformities in a contact etch process to be performed in a later stage.

After the deposition of the silicon dioxide layer 131, the resist mask 103 may be formed on the basis of well-established photolithography techniques. Next, an appropriately designed etch process may be performed in order to remove a portion of the layers 130 and 131 from the first device area 120A. During the corresponding etch process, the silicon dioxide material of the layer 131 may be removed first, followed by a selective etch process for removing the material of the silicon nitride layer 130, wherein the corresponding etch process may be controlled on the basis of an etch stop layer, if required. Due to the significantly increased layer thickness of the silicon dioxide layer 131 at the seam 132, the material may not be completely removed during the etch process when removing the layer 131, thereby significantly blocking the selective etch chemistry during the subsequent etch process for removing the exposed portion of the silicon nitride layer 130.

Consequently, respective material residuals may remain between the transistors in the first device area 120A, which may result in respective non-uniformities during the further processing, for instance, during the deposition of a further dielectric layer of high intrinsic stress designed to enhance the transistor performance of the transistors in the first device area 120A.

FIG. 1b schematically illustrates the semiconductor device 100 at a further advanced manufacturing stage. As shown, a second dielectric layer 140, for instance, having a compressive stress, may be formed above the first and second device areas 120A, 120B. Consequently, due to the residual material 132 previously produced during the removal of the tensile layer 130, the respective stress transfer mechanism may be deteriorated, while, additionally, the residual 132 may provide respective etch non-uniformities in the subsequent patterning sequence for forming respective contact openings.

Similarly, the void 132A in the second device region 120B may also result in a reduced stress transfer mechanism, as well as degraded etch uniformity during the subsequent processing.

As a consequence, upon further device scaling, the respective limitation of deposition processes for dielectric materials of high intrinsic stress, in particular for tensile stressed silicon nitride, may require a significant reduction of the layer thickness to comply with increased aspect ratios encountered in advanced device geometries. However, in this case, the respective strain induced by the stressed dielectric materials may also be significantly reduced, thereby also reducing transistor performance, in particular performance of N-channel transistors.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and semiconductor devices in which an increased amount of stressed dielectric material may be positioned above respective transistor elements, while nevertheless enabling a substantially conformal deposition behavior of the deposition process involved. For this purpose, the deposition of the dielectric material having a specified type of internal stress is divided into two or more individual deposition steps, wherein a buffer material may be intermittently provided to reliably fill any gaps caused by the basic device geometry and the preceding substantially conformal deposition of the stressed dielectric material. It has been recognized that an efficient stress transfer may be realized through the buffer material so that the subsequently deposited stressed dielectric material acts a stress enhancement layer, which, in combination with the previously deposited stressed dielectric material, provides an overall enhanced strain in the transistors under consideration. Consequently, appropriate stress-inducing layers may be deposited above different device regions, such as different types of transistors, in order to produce the required type of strain in these device regions, wherein the layer thickness of these materials may be selected in conformity with the gap-filling capabilities of the corresponding deposition process, thereby significantly reducing the risk for creating any deposition-related irregularities. By forming the buffer material, the resulting surface topography may be "smoothed" to a certain degree so that a further stress enhancement layer, at least for one type of transistor, may be deposited to further enhance performance of at least one type of transistor. At the same time, a negative influence of the stress enhancement layer in device regions, in which none or a different type of stress may be required, may, in some illustrative aspects, be eliminated or at least strongly reduced by treating the stress enhancement layer such that a stress transfer into the underlying buffer material may be reduced or avoided in the respective device regions. In still other illustrative aspects disclosed herein, the deposition sequence for stressed dielectric materials of different internal stress may each be divided into separate steps, for instance, by providing a respective stress enhancement layer for each type of previously deposited stressed dielectric material, thereby even further enhancing the overall strain-inducing mechanism for different device regions, such as different types of transistors and the like. In still other illustrative aspects disclosed herein, a high degree of compatibility with conventional patterning regimes for forming contact openings in the respective dielectric layer stack may be accomplished by selectively removing the material of the stress enhancement layer at an area in which a contact opening is to be formed in a later manufacturing stage. Hence, a respective etch process may encounter substantially the same process conditions as in dielectric layer stacks that are formed on the basis of conventional techniques, i.e., without providing additional stress enhancement layers.

One illustrative method disclosed herein comprises forming a first stress-inducing layer above a first transistor that is formed above a substrate, wherein the first stress-inducing layer generates a first type of stress. The method further comprises forming a second stress-inducing layer above a second transistor formed above the substrate, wherein the second stress-inducing layer generates a second type of stress that differs from the first type of stress. Additionally, a buffer layer is formed above the first and second stress-inducing layers and a third stress-inducing layer is formed above the buffer layer, wherein the third stress-inducing layer induces the first type of stress. Finally, the method comprises selectively reducing a stress level in the buffer layer caused by the third stress-inducing layer above the second transistor.

A still further illustrative method disclosed herein comprises forming a first stress-inducing layer above a first device region comprising one or more first transistors. Moreover, a buffer layer is formed above the first stress-inducing layer and a first stress enhancement layer is formed above the buffer layer, wherein the first stress-inducing and the first stress enhancement layer induce a first type of stress. Finally, the method comprises removing a first portion of the first stress enhancement layer at a first position corresponding to a first contact opening to be formed in the first device region.

One illustrative semiconductor device disclosed herein comprises a first device region comprising one or more first transistors and a first stress-inducing layer located above the one or more first transistors, wherein the first stress-inducing layer induces a first type of stress. The semiconductor device further comprises a buffer material formed above the first stress-inducing layer and a first stress enhancement layer formed above the buffer material, wherein the first stress enhancement layer induces the first type of stress and has a first opening. Furthermore, a dielectric material is formed above the first stress enhancement layer and in the first opening. Additionally, the semiconductor device comprises a first contact element extending through the dielectric material, the first stress enhancement layer, the buffer layer and the first stress-inducing layer, wherein the first contact element is positioned within the first opening and has a lateral dimension less than a lateral dimension of the first opening.

BRIEF DESCRIPTION OF THE DRAWINGS

The disclosure may be understood by reference to the following description taken in conjunction with the accompanying drawings, in which like reference numerals identify like elements, and in which.

Figure 1A:
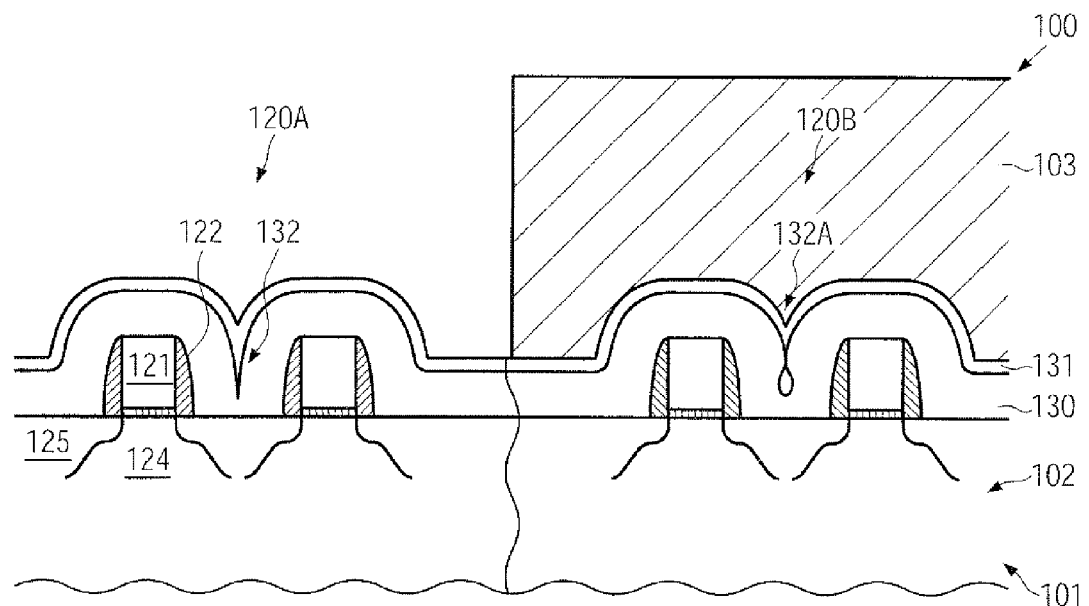
FIGS. 1*a*-1*b* schematically illustrate cross-sectional views of a conventional semiconductor device including densely packed transistors in different device regions receiving different stress-inducing layers on the basis of conventional dual stress line approaches, thereby obtaining a high probability for creating deposition-related irregularities.
Figure 1B:
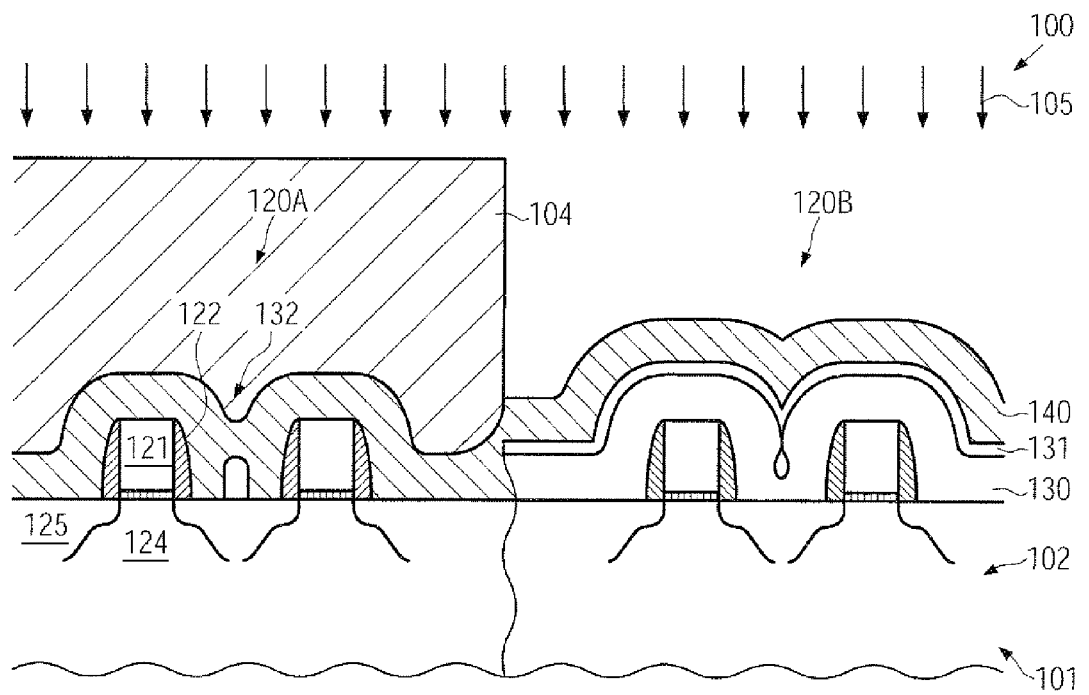

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein generally relates to semiconductor devices and manufacturing techniques in which the deposition of a highly stressed dielectric material above respective device regions may be accomplished on the basis of appropriately selected process parameters, which, on the one hand, result in a high internal stress level and, on the other hand, reduce the probability of creating deposition-related irregularities, such as voids, seams and the like. As previously explained, the selection of process parameter values resulting in high internal stress levels may have an influence on the deposition behavior, for instance, with respect to the conformality or gap-filling capability of the respective deposition process. For example, tensile stressed or compressively stressed silicon nitride material may require process parameter values, for instance with respect to particle bombardment, temperature, pressure and the like, which may result in a reduced conformality or gap-filling capabilities, while changing the respective process parameters might result in a significantly reduced internal stress level. According to the principles disclosed herein, a high internal stress level may be obtained while appropriately selecting a layer thickness so as to maintain the probability of creating deposition-related irregularities at a low level, while additionally providing a further stress-inducing layer, also referred to herein as a stress enhancement layer, after forming an appropriate buffer material on the basis of a deposition technique that reliably fills any gaps in the previously created surface topography. Consequently, a respective dielectric layer stack may comprise a first stress-inducing layer followed by a buffer layer and a stress enhancement layer, which may be referred to herein as a doublet configuration, wherein, in some illustrative aspects, additional buffer layers and subsequent stress enhancement layers may be provided above the basic doublet structure.

Consequently, in some illustrative embodiments, the amount of stressed dielectric material may be increased to further enhance the performance at specified device regions, wherein, in other device regions, an unwanted influence of the stress enhancement layer may be reduced or eliminated by appropriate strain relaxation techniques, selective removal and the like. Thus, dedicated transistor types or specific device regions may receive a doublet configuration substantially without negatively affecting other device areas or transistor types. In still other illustrative embodiments disclosed herein, an appropriate doublet configuration, i.e., a stress-inducing layer followed by a buffer material and a stress enhancement layer providing the same type of stress as the stress-inducing layer, may be individually provided for different device regions or transistor types, thereby even further enhancing the overall device performance. While, in some cases, the additional stress enhancement layer, which may typically be formed of the same material as the basic stress-inducing layer, may be efficiently used for controlling the patterning process for forming contact openings in the dielectric contact stack. In other illustrative embodiments disclosed herein, the stress enhancement layer may be partially removed to define respective openings therein, which may be subsequently filled with dielectric material of the contact layer stack, wherein the openings correspond to areas in which contact openings are to be formed in a later manufacturing stage. Consequently, the stress enhancement layer may not substantially affect the patterning process, thereby providing a high degree of compatibility with well-established patterning regimes.

Figure 2A:
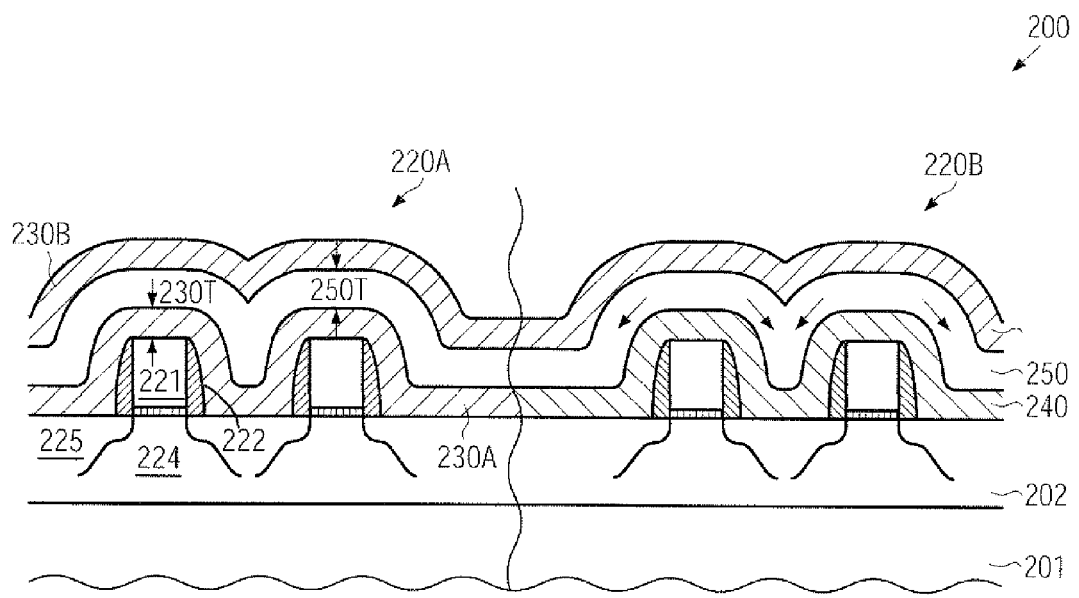
FIGS. 2a-2b schematically illustrate cross-sectional views of a semiconductor device during various manufacturing stages in forming a doublet configuration, wherein the contact dielectric layers act to enhance performance of one type of transistor while not substantially negatively affecting the other type of transistor, according to illustrative embodiments.

FIG. 2a schematically illustrates a cross-sectional view of a semiconductor device 200 comprising a substrate 201 and a semiconductor layer 202 formed above the substrate 201. The substrate 201 may represent any appropriate carrier material for forming thereabove the semiconductor layer 202, which may typically represent a semiconductor material including a moderately high amount of silicon, the conductivity characteristics of which may be modified on the basis of any strain induced in the semiconductor layer 202. It should be appreciated, however, that the semiconductor layer 202 may also comprise other components, such as germanium, carbon, tin and the like, so as to locally or globally adjust the overall electronic characteristics of the semiconductor material in the layer 202. Furthermore, the substrate 201 and the semiconductor layer 202 may represent a "bulk" configuration, when the layer 202 may represent an upper portion of a crystalline material of the substrate 201, while, in other cases, a silicon-on-insulator (SOI) configuration may be defined, when the semiconductor layer 202 is formed on an insulating layer, frequently referred to as buried insulating layer. It should be noted that bulk and SOI configurations may be concurrently present in the device 200, depending on the overall requirements. Furthermore, the semiconductor device 200 may comprise a first device region 220A and a second device region 220B, each of which may comprise one or more transistor elements, which for convenience are also collectively denoted as transistors 220A, 220B. It should be appreciated that although the transistors in the device regions 220A, 220B may have a different configuration with respect to conductivity type, transistor dimensions, threshold voltage and the like, the respective transistor elements are illustrated so as to have the same structure. For example, the transistors in the regions 220A, 220B may comprise a gate electrode structure 221 formed on a gate insulation layer, which separates the gate electrode structure 221 from a channel region 224. Moreover, drain and source regions 225 may be formed in the semiconductor layer 202 on the basis of appropriate different species as required by the conductivity type and the overall configuration of the respective transistor elements. Furthermore, the gate electrode structure 221 may comprise a spacer structure 222 as required for previous and subsequent manufacturing processes. Moreover, depending on the device configuration, any isolation structures (not shown), such as shallow trench isolations and the like, may be provided between two or more of the transistors 220A, 220B, and may also be provided between the device regions 220A, 220B. In the embodiment shown, it may be assumed that the transistors in the device region 220A may require a specific type of strain in the channel regions 224, for instance a tensile strain, while the transistors in the device region 220B may require a different type of strain or may have to be provided in a substantially non-strained state. In other cases, the transistors in the region 220A may require a compressive strain and the transistors in the region 220B may be formed on the basis of a tensile strain or a substantially non-strained state.

The semiconductor device 200 may further comprise, in this manufacturing stage, a first stress-inducing layer 230A formed above the transistors in the first device region 220A, while a second stress-inducing layer 240 may be provided above the transistors of the device region 220B. For instance, the layer 230A may be provided in the form of a silicon nitride, a nitrogen-enriched silicon carbide material and the like, depending on the type of internal stress and the overall process strategy. As previously explained, silicon nitride may be formed with internal compressive or tensile stress, depending on the deposition parameters. Also, nitrogen-containing silicon carbide may be provided to exhibit high compressive stress. Similarly, the layer 240 may be provided with an appropriate internal stress level to enhance performance of the transistors in the device region 220B. As previously explained, the layers 230A and 240 may be deposited on the basis of process parameters which significantly reduce the probability of creating deposition-related irregularities. For instance, a highly conformal deposition behavior may be achieved by selecting an appropriate thickness, as indicated as thickness 230T for the layer 230A, which may substantially avoid a creation of seams between adjacent gate electrode structures 221, as is discussed with reference to the conventional device 100. Thus, for highly scaled semiconductor devices including transistor elements having a gate length, i.e., in FIG. 2a, the horizontal extension of the gate electrode structures 221, on the order of magnitude of 50 nm and less, the value 230T may be appropriately scaled to obtain the desired deposition behavior. For instance, a value of approximately 100 nm or 80 nm and less may be used for the thickness 230T.

It should be appreciated that the layers 230A, 240 may not necessarily be deposited with the same layer thickness, since the different internal stress levels may result in a different deposition behavior, which may allow a different amount of material and thus a different thickness to be deposited in a substantially defect-free manner. For instance, tensile stressed silicon nitride material may have a reduced gap-filling capability compared to compressively stressed silicon nitride material, due to the reduced surface diffusivity of the reactive components during the deposition of the tensile stressed silicon nitride.

Moreover, a buffer material 250 is formed above the layers 230A, 240, which may be comprised of silicon dioxide or any other appropriate dielectric material. The buffer material 250 may be provided to reliably fill any gaps between adjacent transistor elements so as to "relax" the surface topography created during the previous deposition of the layers 230A, 240. Thus, the surface of the buffer material 250 may provide an appropriate geometry for the further deposition of a stress-enhancing material, indicated as further stress-inducing layer or stress enhancement layer 230B. In the embodiment shown, the layer 230B may have the same type of internal stress as the layer 230A to enhance overall performance of the transistors in the first device region 220A.

The semiconductor device 200 as shown in FIG. 2a may be formed on the basis of the following processes. After forming the transistors in the region 220A, 220B using process techniques as also discussed when describing the conventional device 100, the layer 240 or the layer 230A may be deposited, depending on the overall process strategy. It should be appreciated that, prior to the deposition of a respective stressed dielectric material, an etch stop material (not shown) may optionally be deposited to enhance the further patterning of the subsequently deposited material. For convenience, it may be assumed that the layer 230A may be formed first, possibly followed by the deposition of an etch stop or etch control material (not shown), wherein these materials may be selectively removed from the second device region 220B on the basis of well-established photolithography and etch techniques. Thereafter, the layer 240 may be deposited on the basis of appropriately selected process parameters as previously explained, and may then be selectively removed from above the device region 220A on the basis of photolithography and etch techniques, wherein the corresponding removal process may be controlled on the basis of the optionally deposited etch stop or control material or on the basis of a time-controlled strategy. Thereafter, the buffer material 250 may be deposited by using a deposition technique having enhanced gap-filling capabilities, such as a thermally activated chemical vapor deposition (CVD) and the like. For instance, silicon dioxide may be deposited on the basis of TEOS, employing well-established recipes, wherein a thickness 250T, which may vary depending on the underlying surface topography, may be selected to obtain a "topography relaxing" effect, as previously explained. That is, the resulting surface topography of the buffer material 250 may be less pronounced compared to the surface topography obtained after the deposition of the layers 230A, 240, thereby enabling a further reliable and substantially defect-free deposition of the stress enhancement layer 230B. In some illustrative embodiments, the thickness 250T may be greater than the thickness 230T, while, in other embodiments, the thickness 250T may be comparable to the thickness 230T, or may even be less, as long as a desired smoothing effect is achieved. Next, the stress enhancement layer 230B may be deposited with high internal stress of the same type as the stress in the layer 230A.

Consequently, the internal stress level of the layer 230B may act on the buffer layer 250, thereby reducing a respective stress in the buffer layer, which may also act on the underlying layers 230A, 240. In the embodiment shown, the respective internal stress level in the buffer layer 250 created by the overlying material 230B may negatively affect the overall strain-inducing mechanism in the second device region 220B, and the stress level in the layer 240 may be partially compensated. Consequently, in one illustrative embodiment, the stress level in the buffer material 250 created by the layer 230B in the device region 220B may be reduced.

Figure 2B:
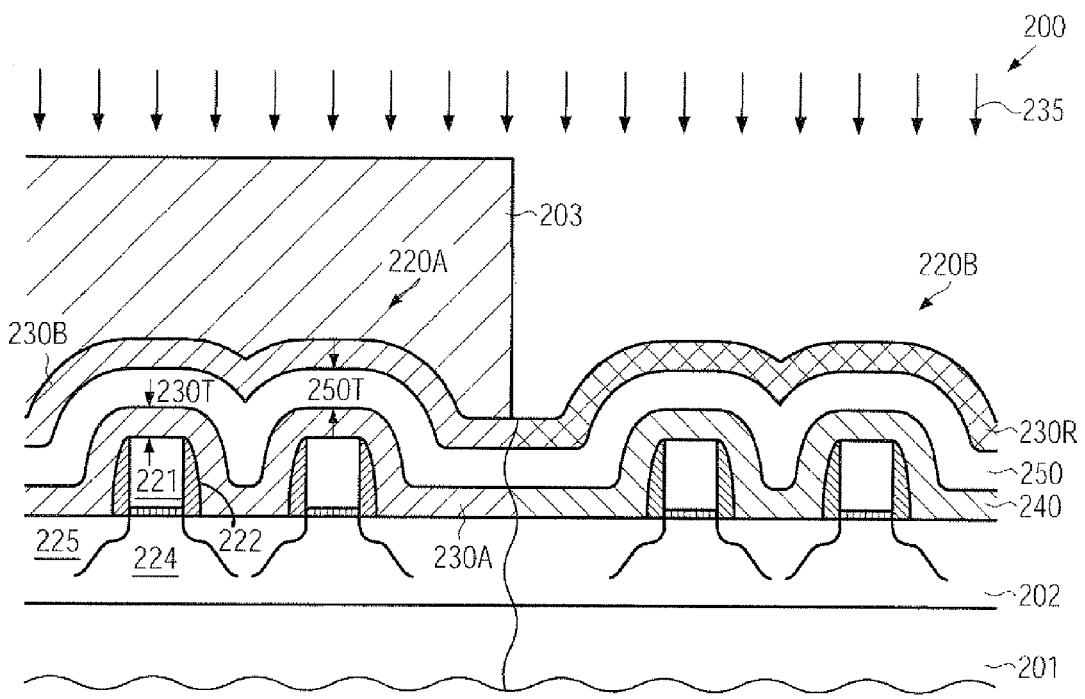

FIG. 2b schematically illustrates the semiconductor device 200 during a treatment 235 for reducing the undesired stress level in the buffer material 250, which, in the embodiment shown, may be accomplished on the basis of an ion bombardment that is performed on the basis of a mask 203, which may be provided as a resist mask on the basis of well-established lithography techniques. The iron bombardment 235 may be performed as an ion implantation process using any appropriate implantation species, such as xenon, germanium, other noble gases and the like. Thus, the internal stress of the stress enhancement layer 230B may be selectively reduced or the stress level in the layer may be substantially relaxed, thereby also reducing any negative influence on the underlying buffer material 250 and finally on the layer 240.

After the treatment 235, the further processing may be continued by removing the mask 203 and depositing a dielectric material, such as silicon dioxide and the like, as may be required for completing a dielectric layer stack for forming therein contact openings. Hence, the further dielectric material may be deposited on the stress enhancement layer 230B and the relaxed portion 230R with an appropriate thickness and may thereafter be planarized on the basis of well-established techniques. During a subsequent patterning sequence for forming respective contact openings, similar process conditions may be achieved in the regions 220A, 220B, since both regions comprise a doublet configuration wherein, however, any negative influence of the portion 230R in the region 220B may be eliminated or at least significantly reduced.

With reference to FIGS. 3a-3d, further illustrative embodiments will now be described, in which a respective doublet configuration with differently stressed stress enhancement layers may be provided.

Figure 3A:
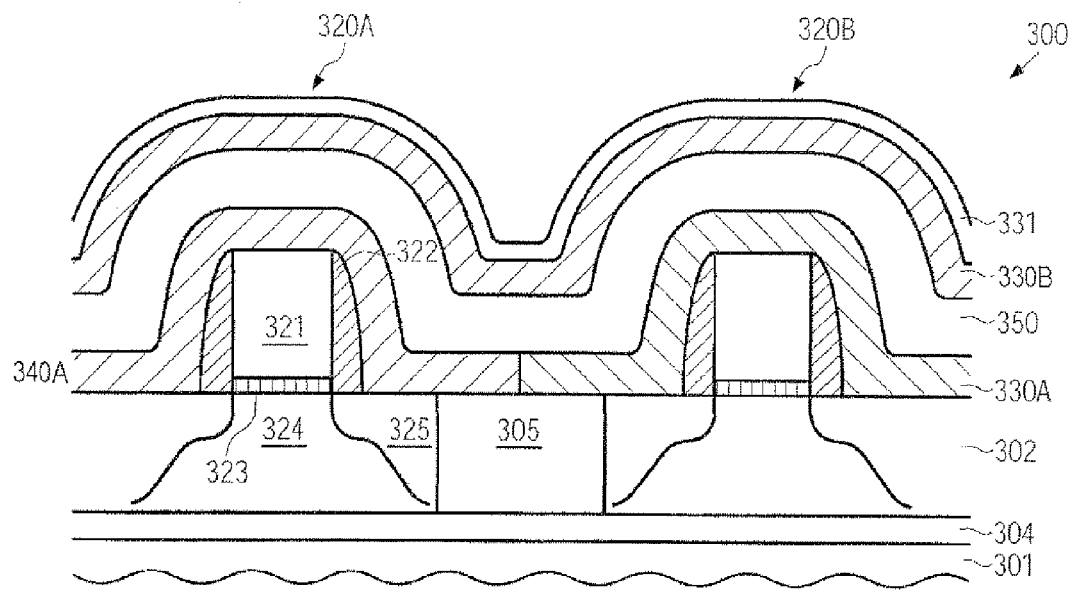
FIGS. 3a-3d schematically illustrate cross-sectional views of a semiconductor device during various manufacturing stages in forming a doublet configuration of an interlayer dielectric layer stack with different types of transistors, according to further illustrative embodiments.

FIG. 3a schematically illustrates a cross-sectional view of a semiconductor device 300 comprising a substrate 301, above which is formed a semiconductor layer 302. Furthermore, in this embodiment, an SOI configuration may be contemplated, wherein a buried insulating layer 304 is provided between the substrate 301 and the layer 302. The semiconductor device 300 may further comprise a first device region 320A and a second device region 320B, which may be represented by respective transistor elements of different conductivity type, which are separated by an isolation structure 305. The transistors 320A, 320B, although differing in their conductivity type, may be shown so as to have substantially the same structure, including a gate electrode structure 321, a gate insulation layer 323, drain and source regions 325, a channel region 324 and, depending on device requirements, a spacer structure 322. Moreover, a stress-inducing layer 330A may be selectively formed above the transistor 320A, while a stress-inducing layer 340A having a different type of internal stress may be formed above the transistor 320B. Furthermore, a buffer material 350 may be formed above the transistors 320A, 320B, followed by a first stress enhancement layer 330B, which, in the embodiment shown, may have the same internal stress level as the layer 330A. It should be appreciated that, with respect to the components described so far, the same criteria apply as previously explained for the device 200 when referring to similar or equivalent components. That is, the stress-inducing layers 330A, 340A may represent tensile stressed and compressively stressed dielectric materials, or vice versa, which may be provided with appropriate thickness to comply with deposition-related constraints, as previously explained. It should further be noted that the layer 330B is shown to have the same internal stress as the layer 330A, while, in other cases, it may be provided with the same internal stress as the layer 340A and the patterning sequence subsequently described with reference to FIGS. 3b-3d may be inversed with respect to the device regions 320A, 320B.

Moreover, an etch stop or etch control layer 331 may be formed above the transistors 320A, 320B, which may be comprised of any appropriate material, such as silicon dioxide and the like.

Figure 3B:
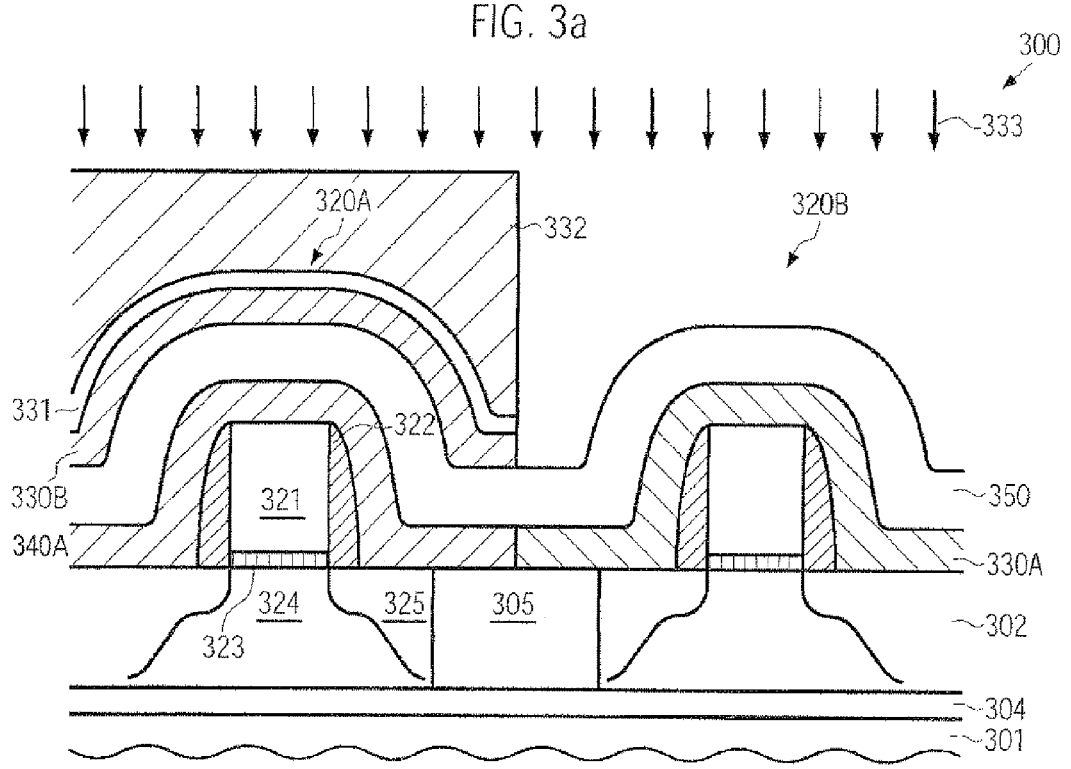

FIG. 3b schematically illustrates the semiconductor device 300 in a further advanced manufacturing stage, in which an etch mask 332 is provided such that the transistor 320A is covered, while exposing the dielectric layers formed above the transistor 320B. Moreover, the device 300 is subjected to an etch process 333 for selectively removing the exposed portion of the layer 331, followed by the removal of layer 330B, wherein the respective phase of the etch process 333 may be controlled by the buffer layer 350 acting as an efficient etch stop material.

Figure 3C:
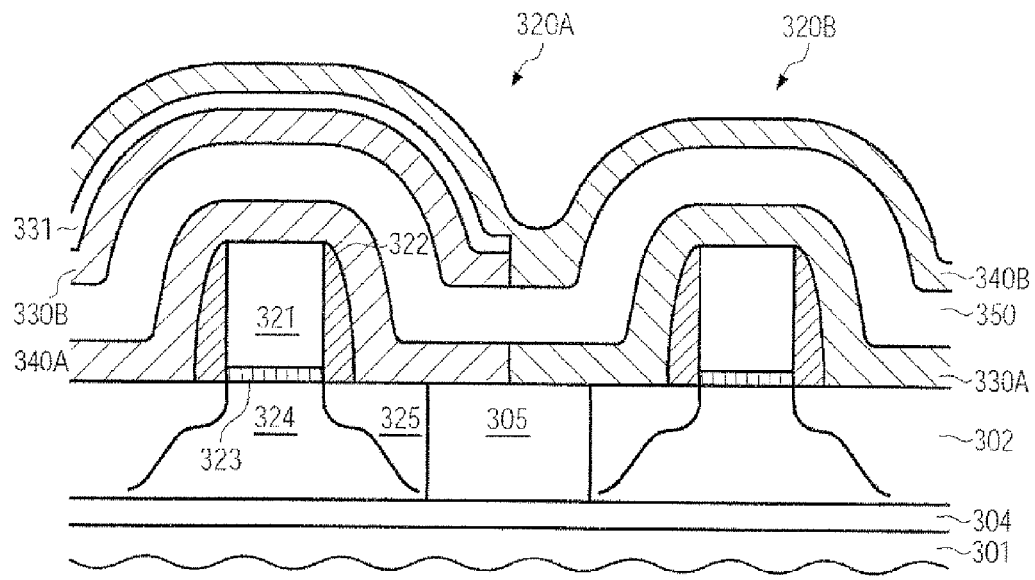

FIG. 3c schematically illustrates the device 300 after the removal of the etch mask 332 and with a further stress enhancement layer 340B having an internal stress level that corresponds to the stress of the layer 340A in order to further enhance the overall strain-inducing mechanism for the transistor 320B. As previously discussed for the layers 240B, 230B, appropriate surface conditions are still provided due to the presence of the buffer material 350, thereby enabling the deposition of the layer 340B substantially without creating deposition-related irregularities, as previously discussed. After the deposition of the layer 340B, a further etch mask may be formed on the basis of photolithography in order to expose the layer 340B above the transistor 320A. In a further etch process, the exposed portion of the layer 340B may be removed, wherein the layer 331 may act as an efficient etch stop or etch control material. Hence, the exposed portion of the layer 340B may be efficiently removed, substantially without negatively affecting the stress enhancement layer 330B. Thus, a highly efficient strain-inducing mechanism may be established for both types of transistors 320A, 320B with a doublet configuration defined, on the one hand, by the layers 330A, 350 and 330B and, on the other hand, by the layers 340A, 350 and 340B. Thereafter, the further processing may be continued by depositing a dielectric material as required for completing the interlayer dielectric layer stack.

Figure 3D:
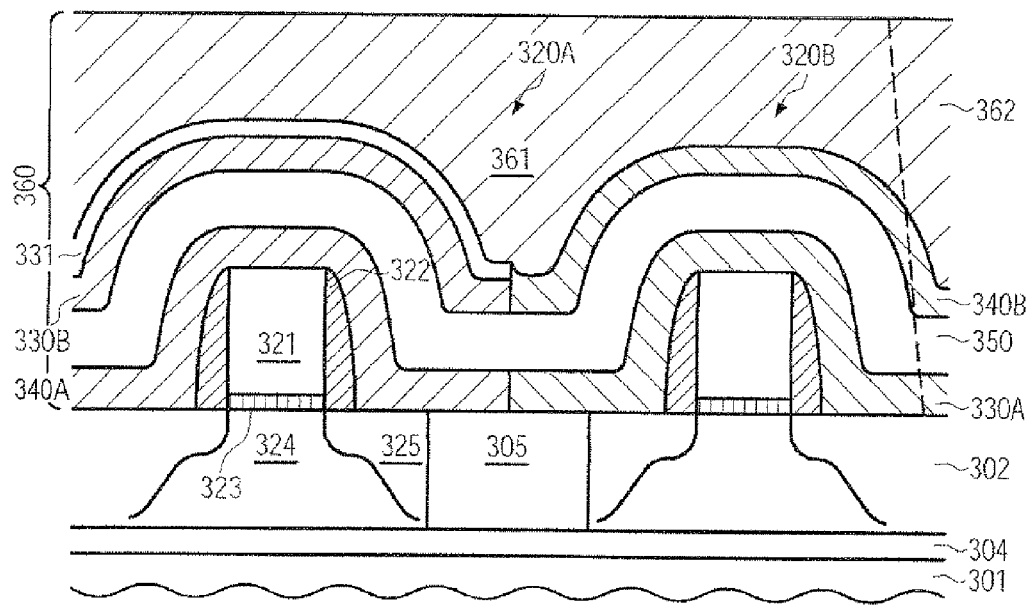

FIG. 3d schematically illustrates the device 300 with a further dielectric material 361, for instance in the form of silicon dioxide and the like, thereby forming an interlayer dielectric layer stack 360, also including the previously deposited materials of the layers 330A, 350, 330B, 331, 340A, 340B, possibly in combination with any other additional etch stop or etch control materials, depending on the overall process strategy. Furthermore, the dielectric material 361 may have a substantially planarized surface topography, which may be accomplished on the basis of chemical mechanical polishing (CMP) and the like, as also previously explained. In a subsequent process sequence, the layer stack 360 may be patterned to receive one or more contact openings 362, wherein the respective patterning sequence may take into consideration the presence of the stress enhancement layer 340B and/or 330B, which may require a respective adaptation of the overall etch chemistry compared to conventional contact layer stacks.

Consequently, the device 300 may provide enhanced transistor performance for transistors requiring a different type of strain, wherein deposition-related irregularities may be substantially avoided, while nevertheless providing an increased amount of stressed material by providing a respectively designed doublet configuration, i.e., a stress-inducing layer followed by a buffer material and a further stress-inducing material, individually for each type of transistor.

As previously explained with reference to devices 200 and 300, the additional stress enhancement layers provided may result in specifically designed patterning sequences for forming respective contact openings. In some illustrative embodiments, as will be described with reference to FIGS. 4a-4f, the stress enhancement layers may be selectively removed above device regions, in which the influence on the underlying buffer material is considered inappropriate or in which the interaction with a corresponding etch ambient for patterning contact openings is not desired. Hence, a patterning regime may be established in which an influence of the stressed enhancement layer(s) may be reduced or avoided.

Figure 4A:
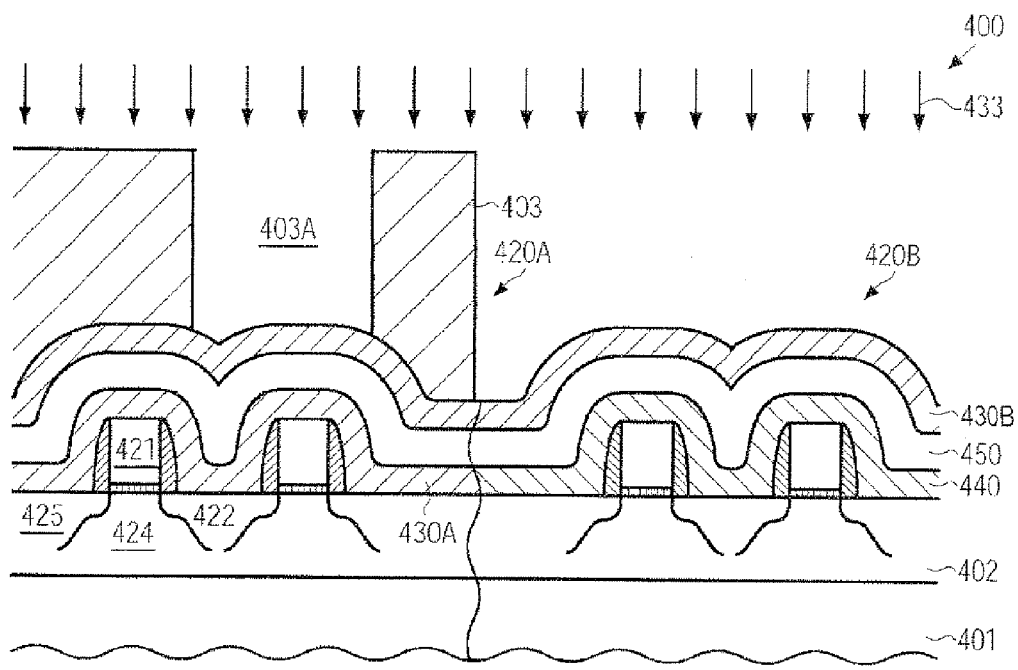
FIGS. 4a-4c schematically illustrate cross-sectional views of a semiconductor device during various manufacturing stages in forming a doublet configuration above one type of transistor, while removing a stress enhancement layer above the other type of transistor and also providing substantially identical etch conditions during the patterning of contact openings, according to still further illustrative embodiments.

FIG. 4A schematically illustrates a semiconductor device 400 comprising a first device region 420A and a second device region 420B formed above a substrate 401 comprising a semiconductor layer 402. The first and second device regions 420A, 420B may comprise one or more transistor elements, as also previously described with reference to the devices 200 and 300. Hence, the respective components are denoted by the same reference numerals except for a "4" as the first digit and, thus, a respective detailed description of these components and any techniques for forming the same will be omitted here. Similarly, dielectric materials for an interlayer dielectric layer stack may be provided in the form of the first stress-inducing layer 430A appropriate for the transistors in the region 420A and a stress-inducing layer 440 appropriate for the transistors in the region 420B. Moreover, a buffer material 450 may be formed above the regions 420A, 420B, followed by a stress enhancement layer 430B, which may exhibit the same type of internal stress as the layer 430A. With respect to these dielectric layers, the same criteria apply as previously explained with reference to the devices 200, 300. Furthermore, in this manufacturing stage, an etch mask 403 may be formed so as to expose the device region 420B, in which an influence of the stress enhancement layer 430B on the underlying transistor elements may not be desired. Furthermore, the etch mask 403 may comprise an opening 403A for exposing a portion of the layer 430B at a position or area that corresponds to a position at which a contact opening is to be formed in a later manufacturing stage. Thus, during an etch process 433, the exposed portions of the layer 430B may be removed, while using the underlying buffer material 450 as an efficient etch stop material, as also previously discussed.

Figure 4B:
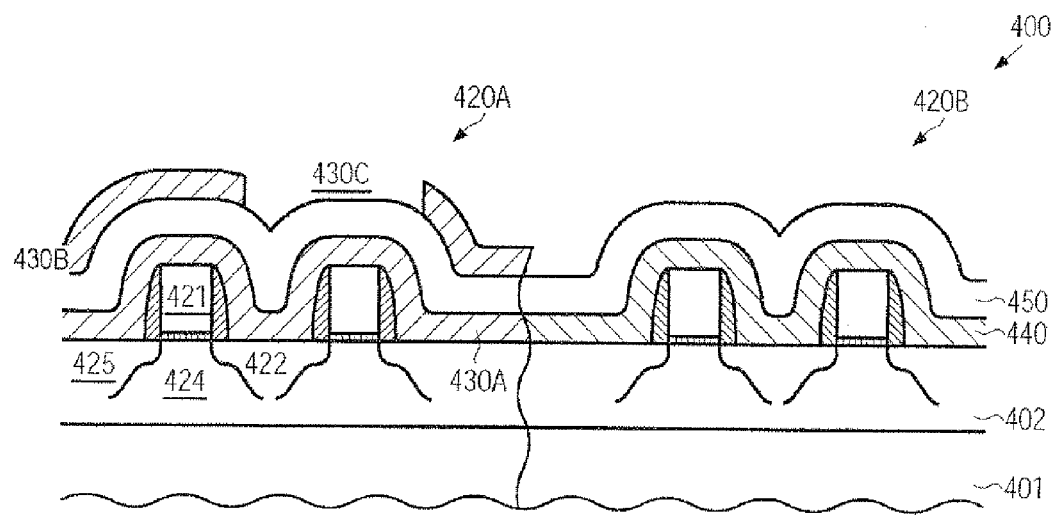

FIG. 4b schematically illustrates the semiconductor device 400 after the etch process 433 and the removal of the etch mask 403. Consequently, the layer 430B may be removed from above the transistors 420B and a respective opening 430C may be provided in the layer 430B in the device region 420A.

Figure 4C:
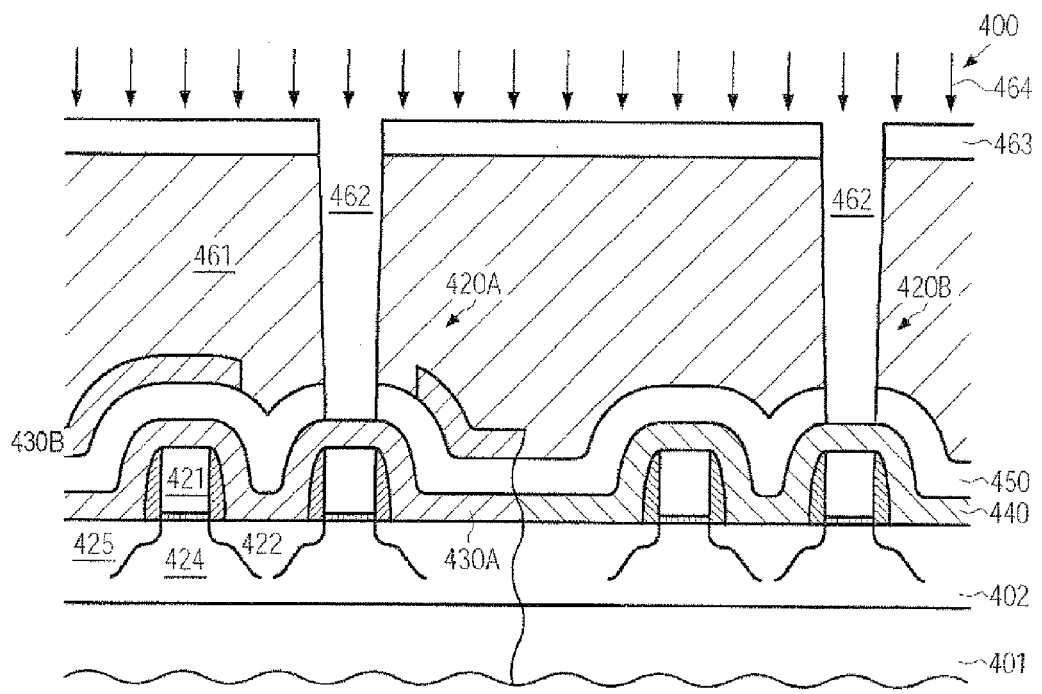

FIG. 4c schematically illustrates the semiconductor device 400 in a further advanced manufacturing stage in which a dielectric material 461 is formed in the region 420A so as to fill the opening 430C and cover the remaining portion of the layer 430B. On the other hand, the material 461 may be formed on the buffer material 450 in the device region 420B. Moreover, an etch mask 463 is provided above the planarized material 461 that is appropriately patterned so as to enable the formation of contact openings 462 during a respective etch process 464. The etch mask 463 may comprise a resist material, anti-reflective coating (ARC) materials and the like, as required for appropriately patterning the contact openings 462. For example, when well-known materials are used for the buffer material 450 and the dielectric material 461, such as silicon dioxide, well-established lithography and etch recipes may be used for the process 464. Due to the previous patterning of the stress enhancement layer 430B, substantially the same process conditions are encountered in the regions 420A, 420B during the etch process 464. That is, after an optional etch step for opening a material layer, such as an ARC layer, formed on top of the material 461, the dielectric material 461 may be etched and subsequently the etch front may proceed to the buffer material 450 in both device regions, such as in the opening 430C previously formed, so as to encounter similar etch conditions in both device regions 420A, 420B. In some embodiments, the buffer material may differ in its material composition with respect to the material 461, and in this case an appropriately adjusted etch chemistry may be used, while in other cases, the same etch chemistry may further be provided so as to etch down to the respective layers 430A, 440, which may act as efficient etch stop materials in accordance with well-established techniques.

Figure 4D:
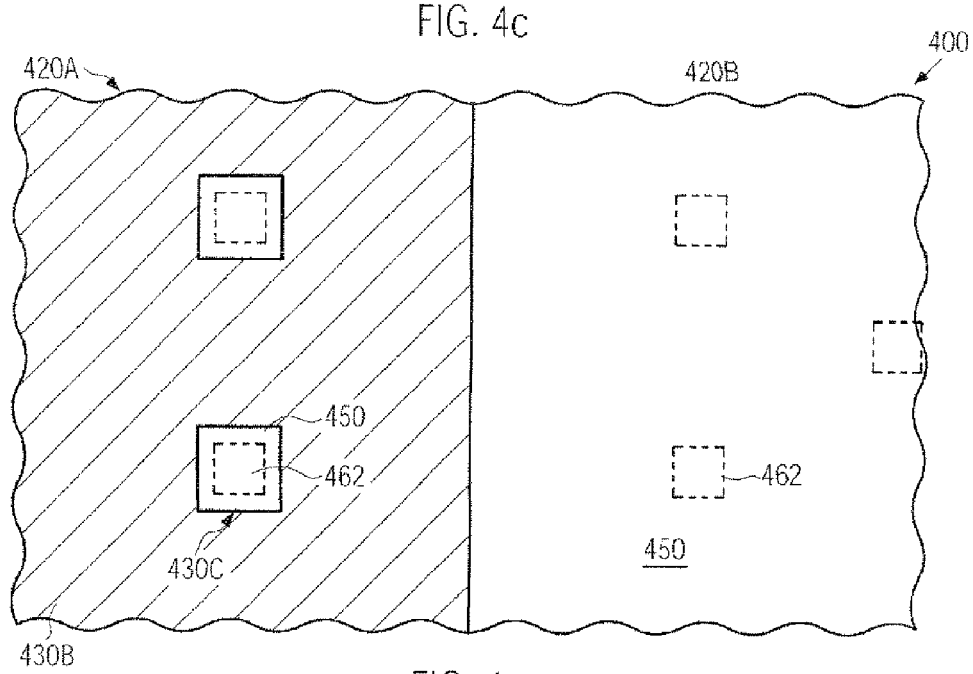
FIG. 4d schematically illustrates a top view of the device as shown in the preceding drawings.

FIG. 4d schematically illustrates a top view of the device 400, wherein, for convenience, the dielectric material 461 may not be shown or may be considered as transparent. Thus, in the device region 420A, the stress enhancement layer 430B comprises the opening 430C, which exposes the buffer material 450 or is filled with the material 461, depending on the respective manufacturing stage. The openings 430C may define an area for receiving the contact openings 462, wherein a lateral dimension of the openings 430C is greater than the lateral dimensions of contact openings 462, which for convenience are shown as square shaped openings. By providing an increased lateral dimension for the openings 430C, any process variations with respect to etch uniformity, overlay accuracy and the like may be taken into consideration. On the other hand, in the region 420B, the contact openings 462 are formed in the material 450 and 461. Thus, as is evident from FIG. 4d, the etch front may encounter substantially the same material composition in both device regions 420A, 420B when approaching the height level of the stress enhancement layer 430B. Consequently, undesired material of the layer 430B may be removed from the device region 420B so as to eliminate any undue influence on the strain level in this device region, while the partial removal of the layer 430B for forming the opening 430C may provide enhanced etch uniformity.

Figure 4E:
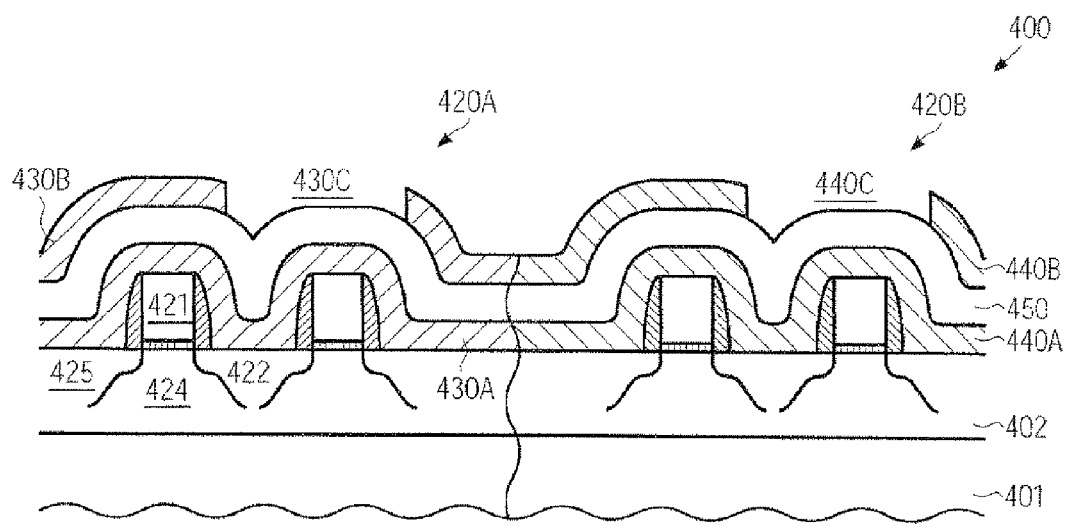
FIGS. 4e-4f schematically illustrate a cross-sectional view and a top view, respectively, of a semiconductor device receiving a doublet configuration for different types of transistors, while partially removing the respective stress enhancement layers to provide a high degree of compatibility with conventional contact layer stacks, according to still other illustrative embodiments.

FIG. 4e schematically illustrates the semiconductor device 400 according to further illustrative embodiments, in which the device region 420B may comprise a stress-inducing layer 440A in accordance with requirements for these transistor elements while additionally comprising a stress enhancement layer 440B inducing the same type of stress as the layer 440A. Thus, both device regions 420A, 420B may comprise a respective doublet structure, i.e., a stack comprised of the layers 430A, 450 and 430B in the device region 420A, and a dielectric stack comprised of the layers 440A, 450 and 440B in the device region 420B. With respect to forming the stress enhancement layers 430B, 440B, the same criteria may apply as previously explained with reference to the device 300. Thus, after patterning the layers 430B, 440B, i.e., the removal of unwanted material of the layer 430B from above the device region 420A and the removal of unwanted material of the layer 440B from above the device region 420B, a further patterning process may be performed so as to define the opening 430C in the layer 430B and a respective opening 440C in the layer 440B.

Figure 4F:
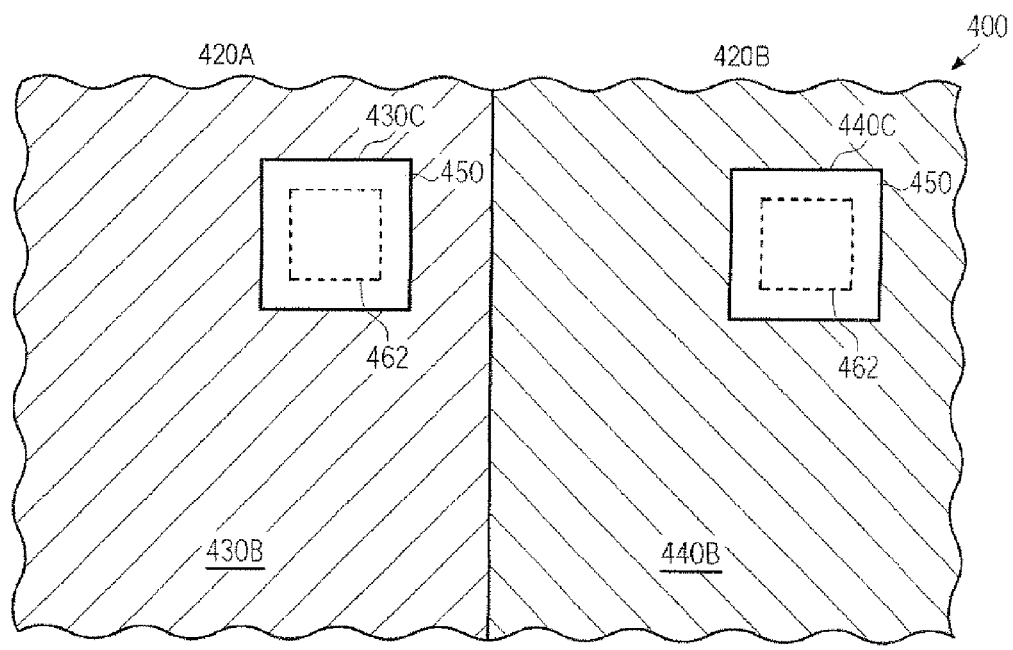

FIG. 4f schematically illustrates a top view of the device 400. As shown, the device region 420A may comprise the opening 430C having lateral dimensions that are greater than respective lateral dimensions of the contact openings 462, as previously discussed. Furthermore, in the device region 420B, the opening 440C embedded in the material 440B may also provide an area for forming a contact opening 462 therein, thereby providing etch conditions that are substantially not influenced by the presence of the stress enhancement layers 430B, 440B. Thus, the further processing may be continued by depositing the material 461 and patterning the contact openings 462 on the basis of techniques as previously described.

As a result, the embodiments disclosed herein provide semiconductor devices and techniques for forming the same in which an influence of a stress enhancement layer in a doublet structure may be reduced or avoided in device regions, in which the corresponding internal stress level may be considered inappropriate, by relaxing the internal stress level of the stress enhancement layer or by removing the layer. In still other illustrative embodiments, an appropriately designed stress enhancement layer may be provided in different device regions, thereby obtaining a specifically designed doublet configuration in the contact layer stack for each different device region so as to allow a deposition of an enhanced amount of appropriately stressed dielectric material while also respecting any deposition-related constraints. Furthermore, the complexity of the patterning sequence for forming contact openings in the contact layer stack may be reduced by selectively removing material of the stress enhancement layer(s) at an area, in which the respective contact openings are located. Consequently, during the patterning process, an influence of the stress enhancement layer(s) on the etch chemistry may be avoided. It should be appreciated that a similar masking technique, as is for instance shown with reference to FIGS. 4a-4F, may also be applied during a relaxation technique, as is for instance described with reference to FIGS. 2a-2B. That is, an appropriately designed implantation mask may be used to expose respective openings, such as the openings 430C, 440C, in a corresponding stress enhancement layer during a relaxation implantation, wherein the influence of the stress may be reduced or compensated for, as is for instance shown in FIG. 2b, so that respective exposed portions of the stress enhancement layer may receive the same amount of structural damage and may therefore provide substantially the same etch conditions during the patterning of contact openings. Thus, also in this case, enhanced process uniformity during the patterning process may be accomplished.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first stress-inducing layer above a first transistor formed above a substrate, said first stress-inducing layer generating a first type of stress;
    forming a second stress-inducing layer above a second transistor formed above said substrate, said second stress-inducing layer generating a second type of stress differing from said first type of stress;
    forming a buffer layer directly on said first and second stress-inducing layers;
    forming a third stress-inducing layer on said buffer layer, said third stress-inducing layer inducing said first type of stress; and
    selectively reducing a stress level in said buffer layer caused by said third stress-inducing layer above said second transistor.

2. The method of claim 1, wherein selectively reducing said stress level of said buffer layer comprises masking said third stress-inducing layer so as to expose a portion thereof above said second transistor and performing an ion bombardment.

3. The method of claim 2, further comprising forming a final dielectric layer above said third stress-inducing layer and forming a contact opening connecting to said first transistor.

4. The method of claim 1, wherein said first type of stress is a compressive stress.

5. The method of claim 1, wherein said first type of stress is a tensile stress.

6. The method of claim 1, wherein said first stress-inducing layer is formed with a layer thickness of approximately 100 nm or less.

7. The method of claim 1, wherein selectively reducing said stress level of said buffer layer induced by said third stress-inducing layer comprises selective removing said third stress-inducing layer from above said second transistor.

8. The method of claim 7, further comprising forming a fourth stress-inducing layer above a remaining portion of said third stress-inducing layer and said second transistor, said fourth stress-inducing layer inducing said second type of stress.

9. The method of claim 8, further comprising selectively removing said fourth stress-inducing layer from above said first transistor.

10. The method of claim 7, further comprising removing a part of said third stress-inducing layer from above said first transistor.

11. The method of claim 9, further comprising partially removing said third stress-inducing layer from above said first transistor and partially removing said fourth stress-inducing layer from above said second transistor, said removed parts corresponding to an area for receiving respective contact openings.

12. A method, comprising:
- forming a first stress-inducing layer above a first device region comprising one or more first transistors;
- forming a buffer layer above said first stress-inducing layer;
- forming a first stress enhancement layer above said buffer layer, said first stress-inducing layer and said first stress enhancement layer inducing a first type of stress;
- removing a first portion of said first stress enhancement layer at a first position above one of the first transistors;
- forming a dielectric material above said first stress enhancement layer and at least said first position to complete a dielectric layer stack after removing said first portion;
- forming a first contact opening through said dielectric layer stack at said first position after forming the dielectric material;
- selectively forming a second stress-inducing layer above a second device region comprising one or more second transistors, said second stress-inducing layer inducing a second type of stress differing from said first type of stress, wherein said second stress inducing layer is formed prior to forming said buffer layer, said first stress enhancement layer is formed above said first and second device regions, and said first stress enhancement layer is selectively removed from above said second device region.

13. The method of claim 12, wherein removing said first portion of said first stress enhancement layer and selectively removing said stress enhancement layer from above said second device region is performed at the same time in a common removal process.

14. The method of claim 12, further comprising selectively forming a second stress enhancement layer above said second stress-inducing layer prior to removing said portion of said first stress enhancement layer, said second stress enhancement layer inducing said second type of stress.

15. The method of claim 14, further comprising removing a second portion of said second stress enhancement layer at a second position corresponding to a second contact opening to be formed in said second device region.

16. The method of claim 15, wherein removing said first and second portions is performed in a common etch process.

* * * * *